United States Patent [19]

Herberg

[11] Patent Number: 4,587,546
[45] Date of Patent: May 6, 1986

[54] LIGHT-TRIGGERABLE THYRISTOR HAVING A LOW LIGHT POWER REQUIREMENT

[75] Inventor: Helmut Herberg, Munich, Fed. Rep. of Germany

[73] Assignee: Siemens Aktiengesellschaft, Berlin & Munich, Fed. Rep. of Germany

[21] Appl. No.: 495,800

[22] Filed: May 18, 1983

[30] Foreign Application Priority Data

Jul. 16, 1982 [DE] Fed. Rep. of Germany ....... 3226613

[51] Int. Cl.⁴ .................... H01L 29/74; H01L 31/06
[52] U.S. Cl. ....................................... 357/38; 357/39; 357/30; 357/51; 357/2
[58] Field of Search ......... 357/38, 38 LA, 39, 39 LA, 357/30 L, 51, 2

[56] References Cited

U.S. PATENT DOCUMENTS

3,832,732  8/1974  Roberts .
4,224,634  9/1980  Svedberg ............................. 357/38

FOREIGN PATENT DOCUMENTS

2348254  8/1975  Fed. Rep. of Germany ........ 357/38 LA
53-25386  3/1978  Japan .................................. 357/30 I

OTHER PUBLICATIONS

G. Hatzinger, "Optoelektronische Bauelemente von Schaltungen", Siemens Aktiengesellschaft, 1977, pp. 36-41, 54-67, 76-77.

W. Gerlach, "Thyristoren", Springer-Verzg, 1979, pp. 390-395.

L. Leipold, "Neveste Ergebnisse von SIPMOS Opto--Triacs", 10, Kolloquium Halbleiterleistungs-Bauelemente und Materialqüte SI, Nov. 1981, (2 pages).

Primary Examiner—Martin H. Edlow
Assistant Examiner—Jerome Jackson, Jr.
Attorney, Agent, or Firm—Hill, Van Santen, Steadman & Simpson

[57] ABSTRACT

A light-triggerable thyristor has a semiconductor body which contains an n emitter contacted by a cathode electrode and lying adjacent a p base which, in turn, is adjacent an n base contacting a p emitter having an anode electrode. A projection of the p base extends up to the boundary surface of the semiconductor body adjacent another projection of the n base which likewise extends up to the boundary surface. In order to obtain a high trigger sensitivity, and, at the same time, a high inhibit capability of the thyristor, a light-sensitive element is connected between an electrode which contacts the second-mentioned projection of the n base and the cathode electrode.

10 Claims, 8 Drawing Figures

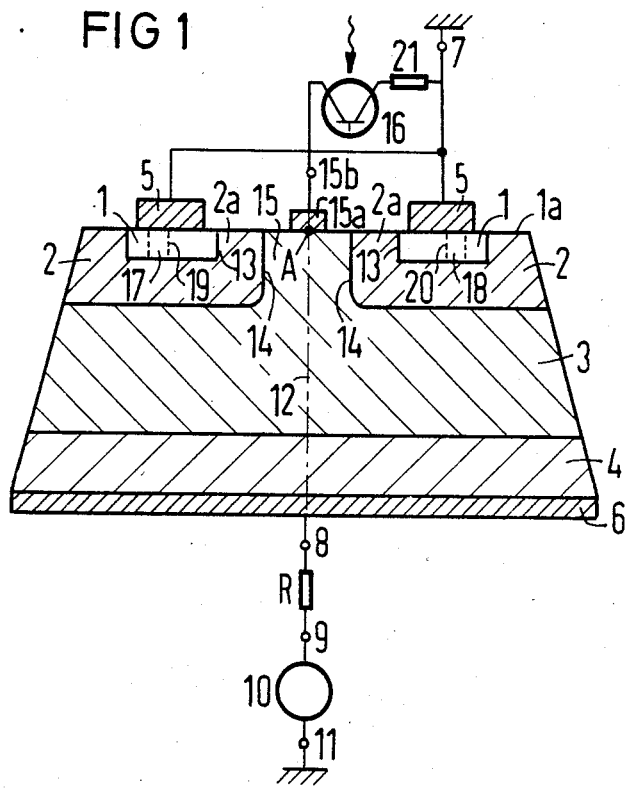
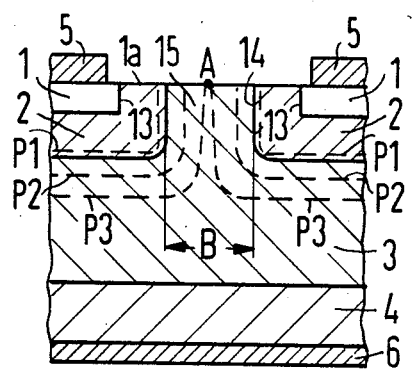
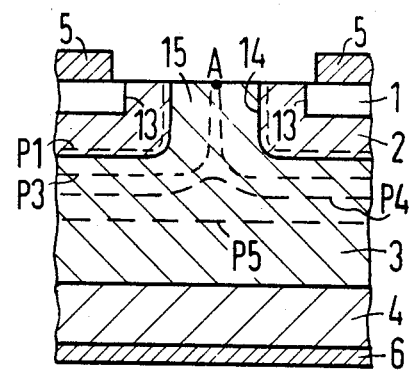

LIGHT-TRIGGERABLE THYRISTOR HAVING A LOW LIGHT POWER REQUIREMENT

CROSS REFERENCE TO RELATED APPLICATION

This application is related to my application Ser. No. 495,750 filed May 18, 1983.

BACKGROUND OF THE INVENTION

1. Field of the Invention

The present invention relates to a light-triggerable thyristor having a semiconductor body which contains an n emitter contacted by a cathode electrode and an adjacent p base, with a p emitter contacted by an anode electrode and having an adjacent n base which is, in turn, adjacent to the p base, and in which thyristor a projection of the p base extends up to the boundary surface adjacent a projection of the n base which likewise extends up to the boundary surface, and to a method for operating such thyristor.

2. Description of the Prior Art

A thyristor of the type set forth above is known from the book of W. Gerlach, entitled "Thyristoren", published by Springer-Verlag, Berlin, 1979, pp. 393–394. Here, a projection of the n base extends up to the boundary surface of the semiconductor body and is directly illuminated during ignition. Under the influence of a sufficiently-high forward voltage, the space charge zone which is built up at the pn junction between the p base and the n base nearly completely fills the projection of the n base. This produces a good efficiency in the illumination-dependent generation of electrons and holes from which the gate trigger current derives, so that the thyristor has a good photosensitivity.

SUMMARY OF THE INVENTION

The object of the present invention is to provide a thyristor of the type set forth above such that the thyristor can be triggered with a very low light power, despite a high inhibit capability and, in particular, despite a high critical voltage rise rate $dU/dt$ relative to a voltage $U$ applied between the anode and cathode electrodes and polarizing the thyristor in the forward conducting direction.

The above object is achieved in a thyristor as described above through the provision of a light-sensitive circuit which is connected between an electrode which contacts the projection of the n base and the cathode electrode.

The advantage attainable with a thyristor constructed in accordance with the present invention is that the light-sensitive circuit can exhibit a relatively low inhibit capability and a high photosensitivity to be brought into agreement therewith without the significantly higher inhibit capability of the system comprising the thyristor and the circuit being negatively influenced. Therefore, a high degree of decoupling between the two parameters of inhibit capability and trigger sensitivity can be achieved with this system.

BRIEF DESCRIPTION OF THE DRAWINGS

Other objects, features and advantages of the invention, its organization, construction and operation will be best understood from the following detailed description taken in conjunction with the accompanying drawings, on which:

FIG. 1 is a sectional view through a first exemplary embodiment of a thyristor constructed in accordance with the invention;

FIG. 2 is a fragmentary section of a thyristor illustrating the course of the space charge zone which forms along the pn junction between the p base and the n base given a low forward voltage;

FIG. 3 is a view similar to FIG. 2 showing the course of the space charge zone given a high forward voltage;

DESCRIPTION OF THE PREFERRED EMBODIMENTS

Figure 4:
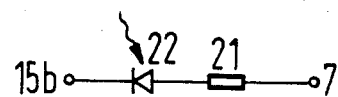
FIGS. 4–7 are schematic circuit diagrams of different light-sensitive circuits for the thyristor system of the present invention.

A thyristor having a semiconductor body of doped semiconductor material, for example, silicon, which exhibits four successive layers of alternating conductivity type is illustrated in FIG. 1. These layers are an n emitter 1, a p base 2, an n base 3 and a p emitter 4. The n emitter 1 is provided with a cathode electrode 5 and the p emitter 4 is provided with an anode electrode 6, whereby the electrodes comprise an electrically-conductive material, for example, aluminum. The electrode 5 is connected to ground by way of a terminal 7 and the electrode 6 is connected by way of a terminal 8 and a load resistor R to a terminal 9 of a voltage source 10, whose other terminal 11 is connected to ground.

The p base 2 comprises a projection 2a which extends up to the cathode-side boundary surface 1a of the semiconductor body. Given a dynamically-balanced thyristor structure, which is indicated by the dot-dash axis of symmetry 12, the elements 1 and 5 are annularly designed, and a central recess 13 of the n emitter 1 is filled by the central projection 2a. When, on the other hand, the n emitter 1 exhibits a strip structure, which is to be understood to mean that the elements 1 and 5 are designed as strips and, for example, extend over the entire boundary surface 1a or over significant portions thereof perpendicular to the plane of the drawing of FIG. 1, then the projection 2a likewise represents a strip-shaped member which separates the elements 1 from one another. The elements 1 can thereby be connected to one another at their ends such that a U-shaped emitter structure arises. The elements 1 can also be designed such that they extend in the boundary surface 1a according to an arbitrary curve (spirals or the like). The projection 2a of the p base 2 has a recess 14 which is filled with a projection 15 of the n base 3 and which extends up to the boundary surface 1a. The recess 14 and the projection 15 can thereby be designed circularly or strip-like in accordance with the projection 2a.

FIG. 2 illustrates the course of the space charge zone which derives in FIG. 1 given a low forward voltage between the terminal 7 and 8, deriving at the pn junction between the p base 2 and the n base 3 polarized in the nonconducting direction, whereas FIG. 3 illustrates the course of the space charge zone given a high forward voltage. The broken lines P1–P5 refer to isoelectric lines which respectively correspond to the fixed potential values. When, in FIG. 2, one proceeds from the basis that the electrode 5 is applied to ground and the electrode 6 is connected to an forward voltage U1, then the line P1 which limits the space charge zone towards the top corresponds to a very low potential value which differs only very little from zero, the line P2 corresponds to a mean voltage value and the line P3 limits the space charge zone towards the bottom and corresponds to a potential value which approximately corresponds to the voltage potential U1. The point A at the boundary surface 1a also exhibits the potential value P3. It is assumed that the value U1 is selected such that the sections of the isoelectric lines P3 proceeding approximately perpendicularly meet at the point A. Given a width B of the projection 15 of approximately 50–200 μm, the voltage U1, given which a configuration of the space charge zone according to FIG. 1 occurs, lies between 20 and 200 volts, for example, depending upon the degree of doping of the n base 3. When the voltage at the electrode 6 is increased above the value U1 (FIG. 3), then the space charge zone enlarges, this being indicated by the additional isoelectric lines P4 and P5. The line P5 then limits the space charge zone downwardly and indicates a potential which approximately corresponds to the increased voltage at the electrode 6. It is thereby essential that each increase of the voltage at the electrode 6 up to the value U1 results in a corresponding increase of the potential at the point A, whereas each increase beyond the value U1 has practically no influence on the potential at the point A.

In the area of the point A (FIG. 1), the projection 15 of the n base 3 is provided with an electrode 15a of electrically-conductive material, for example, aluminum, which is connected by way of a terminal 15b and via a switching segment of a phototransistor 16 to the terminal 7 of the cathode electrode 5.

When the phototransistor 16 is illuminated, then a low-resistance connection between the terminal 7 and the n base 3 is established over the switching segment. Given simultaneous application of an forward voltage generated by the source 10 to bias the electrode 6 positively in comparison to the electrode 5, the semiconductor body behaves like a semiconductor diode comprising the elements 3 and 4 polarized in the forward conducting direction. A gate trigger current begins to flow over the electrode 15, leading to a ignition of the thyristor. Given a d.c. voltage source 10, the quenching of the thyristor occurs, for example, by shutting off the source and, given an a.c. voltage source 10, occurs, for instance, at the next zero axis crossing of the voltage applied to the terminal 8.

The trigger sensitivity of the overall arrangement according to FIG. 1 is all the greater the higher the photosensitivity of the phototransistor 16. According to the invention, therefore, it is advantageous to employ a phototransistor 16 having a high photosensitivity. Since the voltage at the point A and, therefore, the voltage at the phototransistor 16 practically does not exceed the value U1, it suffices to match the inhibit capability of the phototransistor 16 to the voltage U1. The same also applies to the case that a significantly-higher voltage is applied between the electrodes 5 and 6. High voltage rise rates dU/dt of a voltage U applied to the terminal 8 cannot have a negative influence on the operating mode of the phototransistor 16 above the value U1. The inhibit capability of the system comprising the thyristor and the phototransistor 16 relative to high foward voltages at the terminal 8 is determined by the high inhibit capability of the thyristor which can be further increased, in a known manner, for example, by applying fixed emitter shorts to the n emitter 1. These emitter shorts are projections 17, 18 of the p base 2 which fill corresponding recesses 19, 20 of the n emitter and extends up to the boundary surface 1a at which they are contacted by the electrode 5.

A resistor 21 is connected in series with the transistor switching segment of the phototransistor 16 for the purpose of limiting the gate trigger current flowing over the phototransistor 16.

Figure 5:
Figure 6:
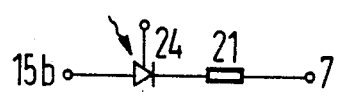
Figure 7:

Within the scope of the invention, other light-sensitive circuits can be provided instead of the photo-transistor 16. Examples of these can be derived from FIGS. 4–7. In detail, FIG. 4 illustrates a photodiode 22, FIG. 5 illustrates a photoresistor 23, FIG. 6 illustrates a photoresistor 24 and FIG. 7 illustrates an opto-triac 25, each of these photosensitive elements being connected between the terminals 15b and 7 of FIG. 1. The opto-electronic components 16 and 22–24 are well known per se and are described, for example, in the book of G. Hatzinger, entitled "Optoelektronische Bauelemente und Schaltungen", published by Siemens AG, Berlin and Munich, 1977, pp. 36–41, 55–66, and 76–77. An opto-triac 25 is described, for example, in the conference papers of the Institut für Angewandte Festkörperphysik, Freiburg i, Br. for the 10th Kolloquium "Halbleiterleistungs-Bauelemente und Materialgüte SI", November 2 and 3, 1981, specifically the contribution "Neueste Ergebnisse von SIPMOS Opto-Triacs", by L. Leipold.

In the circuit arrangement according to the present invention, the light-sensitive circuit need only meet the condition that it produce a low-resistance connection between the terminals 15b and 7 under the influence of light. Given the phototransistor 16 or the photodiode 22, however, only the photoelectric current flows over the electrode 15a under the influence of light, whereas, given the remaining light-sensitive circuit elements, a gate trigger current taken from the load circuit R, 10, 7, 8 flows over the electrode 15a under the influence of light.

The photothyristor 24 and the opto-triac 25 can be designed very trigger-sensitive since the low inhibit capability and the low critical voltage rise rate dU/dt to be connected thereto need be matched only to the voltage U' appearing at the terminal 15b or, respectively, at the point A, this reaching a maximum value of approximately U1.

A further preferred development of the thyristor according to the present invention provides that a plurality of the structures lying at the boundary surface 1a of FIG. 1 are disposed next to one another at a correspondingly-enlarged boundary surface of a semiconductor body whose lateral dimensions amount to a multiple of that illustrated in FIG. 1. In particular, emitters 1 designed at strips can all extend parallel to one another. Given a dynamically-balanced format around the axis of symmetry 12, the further structures lying at the boundary surface 1a are advantageously disposed concentrically about the structure illustrated in FIG. 1. Each of these further structures can be illustrated on the basis of FIG. 1 when it is not the axis 12 but, rather, an axis of symmetry lying outside of the semiconductor body and parallel to the axis 12 that is assigned to the structures 1, 2, 2a, 5, 15 and 15a. The individual structures are advantageously connected parallel to one another by way of their terminals 15b and 7 so that one light-sensitive circuit element, for example the phototransistor 16, is shared by all.

The light-sensitive circuit element 16, 22–24 or 25 can be designed as external components and can be connected to the thyristor terminals 15b and 7 or can also be integrated in the semiconductor body of the thyristor.

Figure 8:
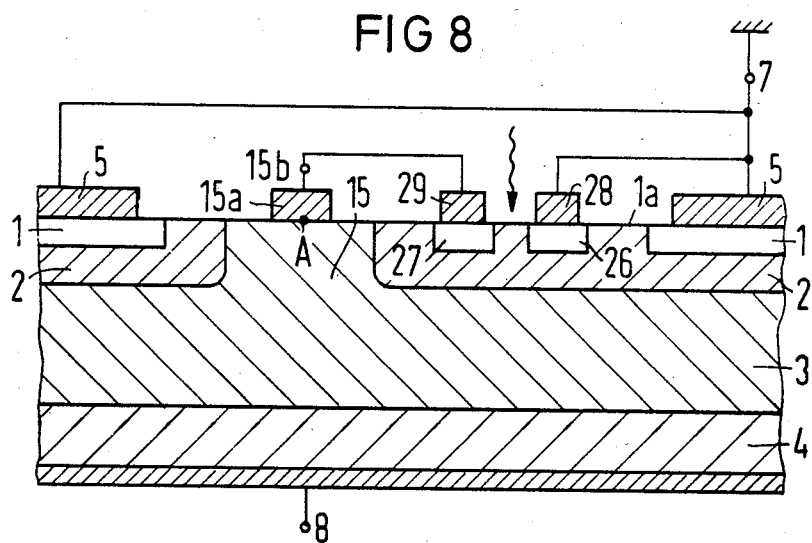
FIG. 8 is a fragmentary sectional view of an integrated circuit embodiment of the invention constructed in accordance with FIG. 1.

Such an integrated circuit, constructed on the basis of FIG. 1, is illustrated in the exemplary embodiment of FIG. 8. The phototransistor 16 is designed as a bipolar transistor whose emitter and collector are the n conductive regions 26 and 27 disposed in the p base 2. Its illuminatable base is formed by a portion of the p base 2 lying between the regions 26 and 27. The regions 26 and 27 are contacted at the boundary surface 1a by respective electrodes 28 and 29 which are respectively connected to the terminals 7 and 15b.

Although not mentioned above, but illustrated in FIGS. 4–7, a current-limiting resistor 21 is also advantageously provided in series with the circuit elements 22–25.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of our contribution to the art.

I claim:

1. In a light-triggerable thyristor arrangement of the type in which a semiconductor body comprises an n emitter carrying a cathode electrode on a boundary surface of the body, a p base contracting the n emitter, an n base contacting the p base, and a p emitter contacting the n base and carrying an anode electrode, and in which a p projection of the p base and an n projection of the n base extend adjacent one another up to the boundary surface, the improvement therein comprising:
    a further electrode carried on the boundary surface and contacting the n projection; and
    a light-sensitive circuit connected between the cathode electrode and said further electrode, said p projection comprising a recess extending to the boundary surface, and
    said n projection extending through and filling said recess.

2. The improved thyristor arrangement of claim 1, wherein:
    said light-sensitive circuit comprises a phototransistor.

3. The improved thyristor arrangement of claim 1, wherein:
    said light-sensitive circuit comprises a photodiode.

4. The improved thyristor arrangement of claim 1, wherein:
    said light-sensitive circuit comprises a photoresistor.

5. The improved thyristor arrangement of claim 1, wherein:
    said light-sensitive circuit comprises a photothyristor including a gate for connection in circuit with said further electrode.

6. The improved thyristor arrangement of claim 1, wherein:
    said light-sensitive circuit comprises an opto-triac including a gate for connection in circuit with said further electrode.

7. The improved thyristor arrangement of claim 1, wherein:
    said light-sensitive circuit is integrated in and forms a part of the semiconductor body.

8. The improved thyristor arrangement of claim 1, wherein:
    said light-sensitive circuit comprises a light-sensitive element and a current-limiting resistor connected in series with the cathode electrode.

9. The improved thyristor arrangement of claim 1, comprising:
    a plurality of the p and n projections, a plurality of the cathode electrodes electrically connected to one another and a plurality of said further electrodes electrically connected to one another, said cathode electrodes and said further electrodes spaced along the boundary surface of the semiconductor body.

10. In a light-triggerable thyristor arrangement of the type in which a semiconductor body comprises a first emitter of a first conductivity type carrying a cathode electrode on a boundary surface of the body, a first base of an opposite second conductivity type contacting the first emitter, a second base of the first conductivity type contacting the first base, and a second emitter of the second conductivity type contacting the second base and carrying an anode electrode, and in which a first projection of the first base and a second projection of the second base extend adjacent one another up to the boundary surface, the improvement therein comprising:
    a further electrode carried on the boundary surface and contacting the second projection; and
    a light-sensitive circuit connected between the cathode electrode and said further electrode, said first projection comprising a recess extending to the boundary surface, and
    said second projection extending through and filling said recess.

* * * * *